United States Patent
Simon

(10) Patent No.: US 7,277,689 B2
(45) Date of Patent: Oct. 2, 2007

(54) TRANSMISSION ARRANGEMENT WITH POWER REGULATION

(75) Inventor: Martin Simon, Otterfing (DE)

(73) Assignee: Infineon Technologies AG, Munich (DE)

( * ) Notice: Subject to any disclaimer, the term of this patent is extended or adjusted under 35 U.S.C. 154(b) by 90 days.

(21) Appl. No.: 10/482,506

(22) PCT Filed: Jul. 1, 2002

(86) PCT No.: PCT/DE02/02378

§ 371 (c)(1),
(2), (4) Date: Jul. 27, 2004

(87) PCT Pub. No.: WO03/005575

PCT Pub. Date: Jan. 16, 2003

(65) Prior Publication Data

US 2004/0253936 A1    Dec. 16, 2004

(30) Foreign Application Priority Data

Jul. 5, 2001    (DE) ................................. 101 32 587

(51) Int. Cl.
*H04B 1/26* (2006.01)
*H04B 17/00* (2006.01)
*H04B 1/04* (2006.01)

(52) U.S. Cl. ................. 455/323; 455/115.1; 455/127.2

(58) Field of Classification Search ............ 455/115.1, 455/115.3, 125, 126, 127.1, 127.2, 323
See application file for complete search history.

(56) References Cited

U.S. PATENT DOCUMENTS

| 5,193,223 | A |   | 3/1993  | Walczak et al. |
| 5,280,643 | A |   | 1/1994  | Ishii |
| 5,293,407 | A | * | 3/1994  | Shibata ........................ 375/297 |
| 5,371,481 | A |   | 12/1994 | Tiittanen et al. |
| 5,805,988 | A |   | 9/1998  | Clayton et al. |
| 5,832,373 | A | * | 11/1998 | Nakanishi et al. .......... 455/126 |
| 6,052,568 | A | * | 4/2000  | Williams .................... 455/126 |
| 2001/0006354 | A1 | * | 7/2001 | Lee ............................ 330/149 |

FOREIGN PATENT DOCUMENTS

| JP | 05122087  A | 5/1993 |
| JP | 05-057917   | 7/1993 |
| JP | 06152285  A | 5/1994 |
| JP | 06326520  A | 11/1994 |
| JP | 08213859  A | 8/1996 |

(Continued)

OTHER PUBLICATIONS

Philips Semiconductors, Power Amplifier Controller for GSM and PCN Systems, Apr. 12, 1999 (1 page).

*Primary Examiner*—Duc M. Nguyen
*Assistant Examiner*—Michael Thier
(74) *Attorney, Agent, or Firm*—Eschweiler & Associates, LLC

(57) ABSTRACT

In a transmission arrangement with power regulation, feedback from an output of a modulator to a digital signal processor is effected via a transmission power detector and an analog/digital converter. The digital signal processor processes baseband signals to be transmitted, and is coupled to the modulator in a transmission path. It is therefore possible to influence the baseband signal amplitudes and/or to program the gain of mixers in the modulator, based on the detected transmission power.

20 Claims, 2 Drawing Sheets

FOREIGN PATENT DOCUMENTS

| | | |
|---|---|---|
| JP | 08-274559 A | 10/1996 |
| JP | 09-102715 A | 4/1997 |
| JP | 11330996 A | 11/1999 |
| JP | 2000196364 A | 7/2000 |
| JP | 2001111369 A | 4/2001 |
| WO | WO 97/26710 A1 | 7/1997 |
| WO | WO99/63676 A1 | 12/1999 |

* cited by examiner

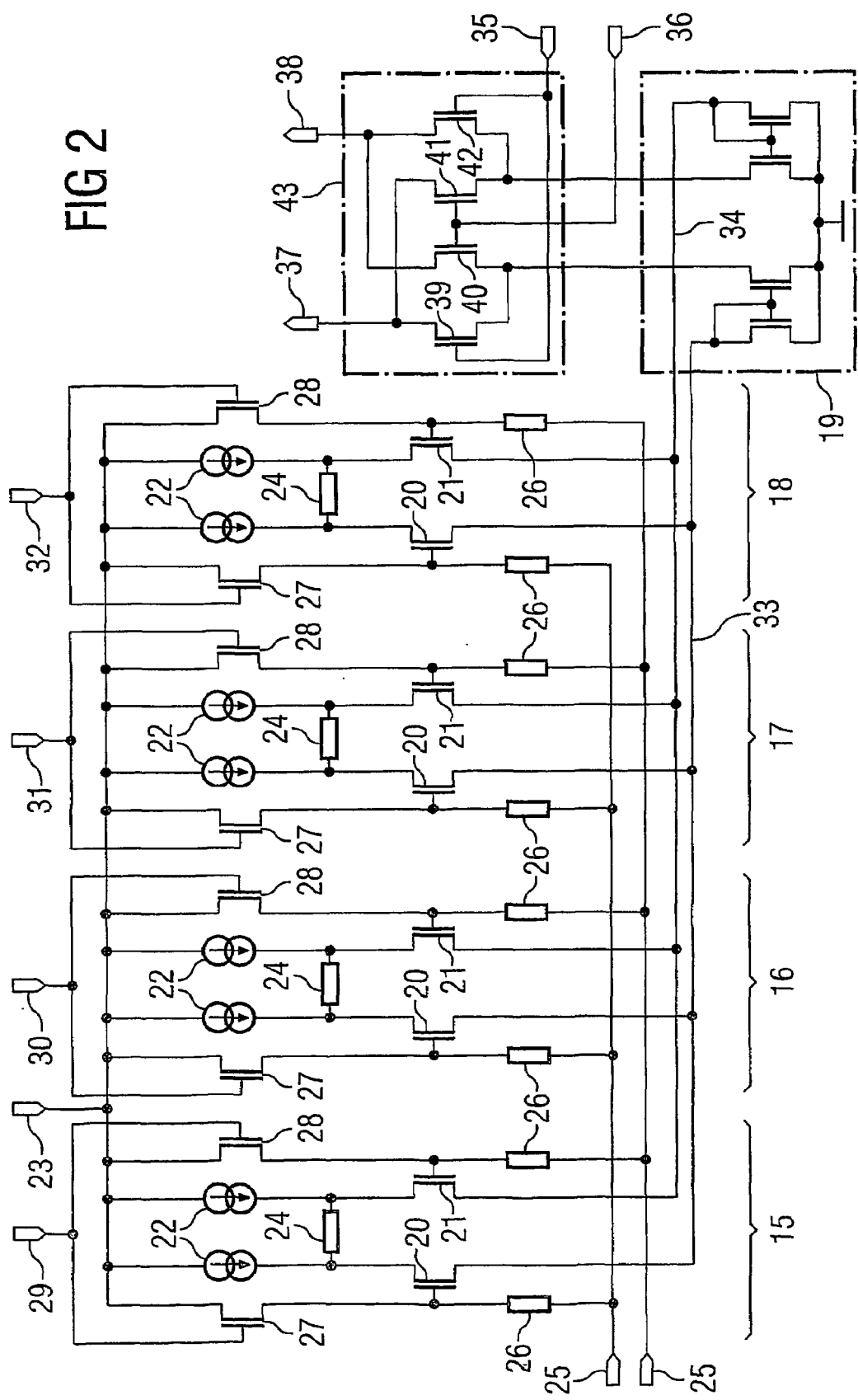

TRANSMISSION ARRANGEMENT WITH POWER REGULATION

FIELD OF THE INVENTION

The present invention relates to a transmission arrangement with power regulation.

BACKGROUND OF THE INVENTION

In mobile radio systems which do not transmit and receive continuously, but rather operate for example with time-division multiple access methods, it is necessary to regulate or to control the output power at an antenna of a mobile station in accordance with the respective specification. Before the beginning of a transmission time slot, it is necessary to regulate the transmission power upward within a predetermined time interval and to regulate it downward again after the end of the transmission time slot. This is referred to as power tamping and is necessary in order not to impermissibly disturb the signal transmissions in preceding or subsequent time slots, the so-called bursts.

A further requirement of the power regulation of a mobile station results from the mobile station's transmission power which is controlled by a base station and which is dependent on the respective received field strength. In order furthermore to prevent an impermissible disturbance of adjacent frequency channels, the transient spectrum during the upward and downward regulation of the transmission power must not have any abrupt changes nor any overshoots.

The output power of a power amplifier, which is usually arranged on the output side in a mobile radio transmitter and amplifies a radio frequency signal to be transmitted, depends on the ambient temperature, the battery or accumulator voltage, the respective transmission frequency, variations in manufacturing parameters during circuit integration, etc. Therefore, the output power of said power amplifier is usually stabilized by means of a regulating circuit.

Different power regulation principles are known depending on the modulation method used: in mobile radio systems which operate with phase or frequency modulation, the transmission power is usually carried out by variation of the supply voltage of the power amplifier by means of a field-effect transistor or by adjustment of the operating point of the amplifier; in mobile radio systems which operate with amplitude modulation, a controllable preamplifier is connected upstream of the power amplifier and regulates the input power of the power amplifier.

In one prior art example, the output power of the power amplifier is measured with the aid of a power detector, formed as a Schottky diode. This measured quantity is fed to an analog regulating circuit, which in turn drives the power amplifier. The reference quantity for said analog regulating circuit is supplied by a digital/analog converter driven by the baseband signal processing. The amplifier itself and also the control unit for said power amplifier are in this case arranged in different integrated circuits or constructed with discrete semiconductor components.

Another prior art example specifies a transmission arrangement with a direct modulator. The baseband signal processing unit is driven in a manner dependent on the power level of the transmission signal. A conventional automatic gain control is additionally provided between modulator output and antenna.

In another prior art example additional multipliers are provided in the baseband of a transmitter and condition the useful signal before modulation onto a carrier in a manner dependent on a power level received with other mobile units.

It is an object of the present invention to specify a transmission arrangement with power regulation which has a low current requirement.

SUMMARY OF THE INVENTION

The present invention provides a transmission arrangement with power regulation having a transmission path comprising a block for the digital processing of a useful signal to be transmitted, a digital/analog converter, which is connected downstream of the block for digital signal processing, and a modulator, which is coupled to an output of the digital/analog converter, for modulating a carrier signal with the useful signal to be transmitted, and which provides a radio frequency transmission signal at an output, and a feedback path comprising a power detector which is coupled to the output of the modulator, with an analog/digital converter connected downstream, with an output at the analog/digital converter which is coupled to the block for digital signal processing, for influencing the amplitude of the radio frequency transmission signal in a manner dependent on a power measured by the power detector, the modulator having a control input for setting the gain of the modulator, and the control input of the modulator being coupled to the block for digital signal processing, for influencing the amplitude of the radio frequency transmission signal in a manner dependent on the power measured by the power detector.

The described feedback loop with an additional analog/digital converter and via the digital signal processing in the baseband of the transmitter makes it possible to dispense with a regulating circuit of an amplifier regulation formed using analog circuitry. The principle described makes it possible to obtain a larger dynamic range of the transmitter.

In accordance with the principle, a power amplifier, which is preferably coupled to the output of the modulator, is accordingly regulated by means of its input power, not by means of the variation of a control signal of the amplifier for regulating the gain.

If a power amplifier is connected to the output of the modulator, then the tapping off of the feedback loop may be effected either at the input or advantageously at the output of the power amplifier.

The regulation described is suitable for transmitters both with amplitude modulation and with phase modulation and can be applied both to time-division multiple access methods and to code-division multiple access methods.

In one preferred embodiment of the present invention the block for digital signal processing comprises a means for influencing the amplitude of the useful signal to be transmitted in a manner dependent on the power measured by the power detector.

In this case, said means for influencing the amplitude of the useful signal to be transmitted is preferably connected upstream of the digital/analog converter.

During an upward regulation of the output power of the transmitter, it is possible to influence the amplitude of the useful signals to be transmitted, preferably in the baseband signal processing chain, by means of a programmed curve shape continuously up to the beginning of a transmission time slot. The system requirements that are usually defined in mobile radio standards for the permissible transient spectrum during the so-called power ramping are thereby complied with. Correspondingly, the downward regulation of the output power after the end of a transmission time slot may likewise be effected by influencing the amplitudes of the useful signal to be transmitted as early as in the digital signal processing, still prior to a digital/analog conversion.

In a further preferred embodiment of the present invention, the modulator has a gain that can be set via a control input, the control input of the modulator being coupled to the block for digital signal processing, for influencing the amplitude of the radio frequency transmission signal in a manner dependent on the measured power.

As an alternative, or in addition to the described output power regulation by variation of the baseband signal amplitudes, a power regulation may be effected by driving the modulator in the transmitter. The changeover or variation of the gain of the modulator may be effected for example by amplifier or mixer cells that are connected in parallel being connected in or disconnected in stepwise fashion.

While the influencing of the amplitudes of the baseband signals is preferably used to effect the upward and downward regulation of the output power before and after transmission time slots, the influencing of the gain of the modulator in the transmission signal processing chain is preferably suitable for providing the different output power levels, which may be prescribed by a fixed station in mobile radio. In a manner dependent on the transmission power of the base station or fixed station and in a manner dependent on the reception conditions of the mobile station, in accordance with the respective mobile radio standard, a specific power level of the mobile station is usually to be selected from a prescribed set of power levels of the transmission power.

In a further preferred embodiment of the present invention, the modulator is designed for processing complex-valued transmission signals, with a first mixer, which is coupled to the block for digital signal processing via an in-phase branch, and with as second mixer, which is coupled to the block for digital signal processing via a quadrature branch. A summation element is furthermore provided, which couples the output of the first mixer and the output of the second mixer and provides the radio frequency transmission signal at its output.

Preferably, a respective digital/analog converter is arranged in the in-phase branch and in the quadrature branch, for the purpose of coupling the block for digital signal processing to the inputs of the mixers of the modulator.

Such a modulator for providing a homodyne transmission architecture may be formed for example as a so-called vector modulator which, for mixing in-phase and quadrature signals with a local oscillator signal with 0a carrier frequency, comprises Gilbert-type mixer cells of analog construction, for example. The influencing of the gain of such a vector modulator may be effected stepwise for example by individual mixer or modulator cells connected to one another in a parallel circuit being connected in or disconnected.

In a further preferred embodiment of the present invention, a low-pass filter is provided for the coupling of digital/analog converter and modulator.

If the transmitter is designed for processing complex-valued signals, then a respective low-pass filter is preferably connected between digital/analog converters and modulator.

In a further preferred embodiment of the present invention, a power amplifier is connected to the output of the modulator for the purpose of amplifying the radio frequency transmission signal.

Power amplifiers which are arranged on the output side in a transmitter and, by way of example, couple a modulator to a radio frequency antenna usually have a control input for influencing the gain of the power amplifier. In the case of the present principle, however, the power regulation is effected by influencing the input power of the power amplifier, but without an additional pre-amplifier, usually referred to as an AGC (automatic gain control) amplifier.

In a further preferred embodiment of the present invention, the power amplifier has a constant gain. For this purpose, by way of example, a constant signal may be fed to the control input for regulating the gain. Accordingly, the power amplifier is neither itself directly driven with a desired power signal, nor is there need for a preamplifier or AGC amplifier connected upstream which is driven by feedback loop for power regulation.

In a further preferred embodiment of the present invention the modulator comprises a multiplicity of mixer cells connected in parallel which can be connected in/disconnected independently of one another by means of the signal that can be fed to the control input of the modulator.

BRIEF DESCRIPTION OF THE DRAWINGS

The invention is explained in more detail below using an exemplary embodiment with reference to the drawings.

In the figures:

FIG. 2 shows an exemplary realization of the mixer cells of the modulator of FIG. 1 with Gilbert mixers connected in parallel.

DETAILED DESCRIPTION

Figure 1:
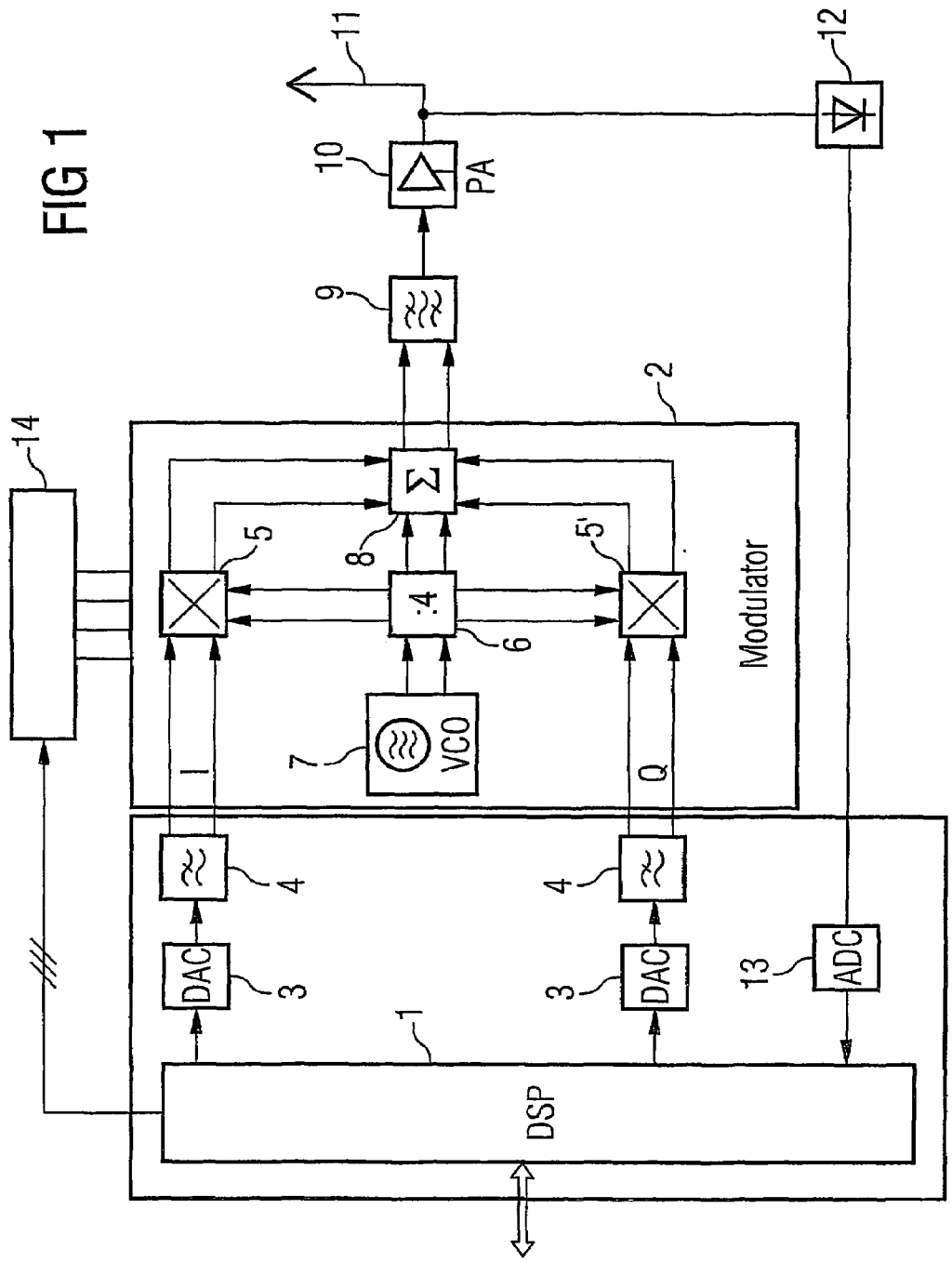
FIG. 1 shows a simplified block diagram of a transmission arrangement according to the invention in an exemplary embodiment.

Reference symbols in the drawings are:
1 Digital signal processing
2 Modulator
3 DA converter
4 Low-pass filter
5 Mixer
5' Mixer
6 Frequency divider
7 VCO
8 Summation node
9 Bandpass filter
10 Amplifier
11 Antenna
12 Power detector
13 AD converter
14 Interface circuit
15 Mixer
16 Mixer
17 Mixer
18 Mixer
19 Current mirror
20 Transistor
21 Transistor
22 Current source
23 Supply potential terminal
24 Resistor
25 Useful signal input
26 Resistor
27 Switch
28 Switch
29 Control input
30 Control input
31 Control input
32 Control input 33 Summation node
34 Summation node
35 Local oscillator input
36 Local oscillator input
37 Radio frequency output
38 Radio frequency output
39 Transistor
40 Transistor
41 Transistor
42 Transistor
I in-phase branch
Q Quadrature branch.

FIG. 1 shows a transmission arrangement with power regulation which comprises a block for digital baseband signal processing 1, which is coupled to a modulator 2 via an in-phase branch I and a quadrature branch Q.

In-phase branch I and quadrature branch Q in each case comprise a digital/analog converter 3, with an input coupled to a respective output of the digital signal processing device 1. A respective low-pass filter 4 is connected downstream of the digital/analog converters 3. The modulator 2 has a respective mixer 5, 5' for in-phase branch I and quadrature branch Q, said mixer being connected to a respective low-pass filter 4 in each case by a first input, this connection being designed to carry differential signals. The mixers 5, 5' each have a further input connected to a frequency divider 6, which is in turn driven by a voltage controlled oscillator, VCO, 7. VCO 7 and frequency divider 6 serve to provide a respective local oscillator signal with a carrier frequency, which are in each case modulated with the in-phase and quadrature useful signal components provided by the block for digital signal processing 1.

The mixers 5, 5' each have an output which is connected to a respective input of a common summation element 8, which combines the radio frequency components—provided by the mixers 5, 5'—of the signal to be transmitted with one another in an addition. A power amplifier 10 is connected to the output of the summation element 8 via a bandpass filter 9, which power amplifier amplifies a radio frequency transmission signal provided by the summation element 8 on the output side, said transmission signal already having been bandpass-filtered, and feeds it to an antenna 11. The power amplifier 10 has a control input for adjusting the gain of the power amplifier, to which a constant control signal can be fed in the present transmitter.

In addition to the described transmission signal path of the transmitter arrangement with power regulation, in order to provide the power regulation, provision is furthermore made of feedback path 12, 13, with a power detector 12, which is formed as a Schottky diode and is coupled to the output of the power amplifier 10. The power detector 12 provides, at an output, a signal which is dependent on the output power of the power amplifier 10 and is fed to an analog/digital converter 13 connected to said output. The output of the analog/digital converter 13 is coupled to the block for digital signal processing 1. The digitized signal thereby provided, which is dependent on the actual instantaneous output power of the power amplifier 10, serves on the one hand for a signal-dependent influencing of the amplitudes of the useful signal to be transmitted in the digital signal processing 1, in particular for providing the so-called power ramping before the beginning and after the end of transmission time slots, that is to say for regulating the output power upward and downward, and on the other hand for driving the gain of the mixers 5, 5' in the modulator 2 via an interface 14. The coupling of the block for digital signal processing 1 to control inputs of the mixers 5, 5' via a three-conductor bus and via the interface 14 enables in particular the power regulation in accordance with the desired transmission power level during a transmission time slot.

The mobile radio transmitter with power amplifier regulation by adaptation of the baseband signal amplitudes and by influencing of the modulator gain enables a large dynamic range, on the one hand, and a low current consumption of the modulator, on the other, particularly when a small output power is set. As a result of this, particularly when the transmitter is employed in the mobile area, it is possible to achieve a significantly lengthened time between the two processes of charging an accumulator for the operation of a mobile radio transmitter, for example, of a mobile or cordless telephone.

The transmission arrangement in accordance with the block diagram of FIG. 1 is suitable both for amplitude modulation and for phase modulation and can be applied both to time-division and to code-division multiple access methods.

FIG. 2 shows an exemplary embodiment of one of the mixers 5, 5' in accordance with FIG. 1. The mixer in accordance with FIG. 2 is accordingly to be provided twice in the case of an application in a vector modulator 2 in accordance with FIG. 1.

In this case, four mixer cells 15 to 18 which comprise differential amplifiers are connected in parallel and exhibit feedback. The cells 15 to 18 can be connected/disconnected independently of one another by means of a signal that can be provided by the digital signal processing device 1. The desired transmission power is thereby set by varying the gain of the mixers 5, 5''. Furthermore, a current mirror 19 is provided, to the input of which the outputs of the mixer cells 15 to 18 are connected to form a summation node 33, 34 for summing the output currents of the differential amplifiers of the mixer cells 15 to 18. The differential amplifiers of the mixer cells 15 to 18 each comprise two transistors 20, 21 which are connected to a supply potential terminal 23 via a respective current source 22. Via a respective resistor 24, the transistors 20, 21 are coupled to one another on the current source side via a respective one of their load terminals. At a first input 25 designed for carrying differential signals, a useful signal to be transmitted or a component of a useful signal to be transmitted can be fed to the control inputs of the transistors 20, 21 of the mixer cells 15 to 18 via a respective resistor 26.

Furthermore, the control inputs of the transistors 20, 21 of the mixer cells 15 to 18 are connected to the supply potential terminal 23, in a manner that allows them to be connected in/disconnected via a respective further transistor 27, 28, operating as a switch, for connecting-in/disconnecting the mixer cells 15 to 18 in a manner dependent on a control signal present at control inputs 29, 30, 31, 32. A respective further load terminal of the transistors 20 of the mixer cells 15 to 18 and a respective further load terminal of the transistors 21 of the mixer cells 15 to 18 are connected to one another at a respective summation node 33, 34. The summation node 33, 34 is connected to a further mixer stage 43 via a current mirror 19 for carrying a differential signal, which mixer stage modulates a carrier signal that can be fed in at a radio frequency input 35, 36 with the amplified differential useful signal provided by the current mirror outputs and provides a modulated radio frequency signal at a radio frequency output 37, 38. Two pairs of transistors 39, 40; 41, 42 are provided for this purpose, at whose control inputs, which are coupled to the input 35, 36, the local oscillator signal with the carrier frequency is fed and whose load terminals couple the differentially operating current mirror 19 to the radio frequency output 37, 38 for providing a differential signal.

When a small power is set, the current consumption of the modulator in accordance with FIG. 2 is greatly reduced on account of the large feedback resistance used in the mixer cells.

It lies within the scope of the invention also to use other mixers or modulators with adjustable gain instead of those shown in FIG. 2. In this case, the influencing of the gain may be effected in continuously variable fashion or in stepped fashion, as shown.

The invention claim is:

1. A transmission arrangement with power regulation, comprising:
   a transmission path comprising a digital signal processor for the digital processing of a useful signal to be transmitted, a digital/analog converter, which is connected downstream of the digital signal processor, and a modulator, which is coupled to an output of the digital/analog converter, for modulating a carrier signal with the useful signal to be transmitted, and which provides a radio frequency transmission signal at an output thereof;
   a power detector coupled to the output of the modulator;
   an analog/digital converter having an input coupled to the power detector and having an output coupled to the digital signal processor; and
   the modulator having a control input for setting the gain of the modulator, the control input coupled to the digital signal processor for permitting the amplitude of the radio frequency transmission signal to be influenced in a manner dependent on power measured by the power detector,
   wherein the gain of the modulator is influenced by individual mixer cells, and wherein each of the mixer cells is, independently of the other mixer cells, connectable into and disconnectable from parallel combination with any of the other mixer cells.

2. The transmission arrangement as claimed in claim 1, wherein the digital signal processor comprises a means for influencing the amplitude of the useful signal in a manner dependent on the power measured by the power detector.

3. The transmission arrangement as claimed in claim 2, wherein the modulator comprises at least one mixer, having the control input for setting the gain.

4. The transmission arrangement as claimed in claim 1, wherein the modulator comprises at least one mixer, having the control input for setting the gain.

5. The transmission arrangement as claimed in claim 4, wherein the modulator is for processing complex-valued transmission signals, the modulator including a first mixer which is coupled to the digital signal processor via an in-phase branch, and a second mixer which is coupled to the digital signal processor via a quadrature branch, the modulator also including a summation element coupled to an output of the first mixer and an output of the second mixer and having an output that provides the radio frequency transmission signal.

6. The transmission arrangement as claimed in claim 1, wherein the modulator is for processing complex-valued transmission signals, the modulator including a first mixer which is coupled to the digital signal processor via an in-phase branch, and a second mixer which is coupled to the digital signal processor via a quadrature branch, the modulator also including a summation element coupled to an output of the first mixer and an output of the second mixer and having an output that provides the radio frequency transmission signal.

7. The transmission arrangement as claimed in claim 6, wherein the digital signal processor comprises a means for influencing the amplitude of the useful signal in a manner dependent on the power measured by the power detector.

8. The transmission arrangement as claimed in claim 7, wherein the modulator comprises at least one mixer, having the control input for setting the gain.

9. The transmission arrangement as claimed in claim 1, including a low-pass filter coupled between the digital/analog converter and the modulator.

10. The transmission arrangement as claimed in claim 1, including a power amplifier coupled to the output of the modulator for amplifying the radio frequency transmission signal.

11. The transmission arrangement as claimed in claim 10, wherein the power amplifier has a control input for receiving a constant control signal for controlling the gain of the power amplifier.

12. The transmission arrangement of claim 1, where the influencing of the gain of the modulator is effected stepwise by the individual mixer cells.

13. A transmission arrangement with power regulation, comprising:
    a transmission path comprising a digital signal processor for the digital processing of a useful signal to be transmitted, a digital/analog converter, which is connected downstream of the digital signal processor, and a modulator, which is coupled to an output of the digital/analog converter, for modulating a carrier signal with the useful signal to be transmitted, and which provides a radio frequency transmission signal at an output thereof;
    a power detector coupled to the output of the modulator;
    an analog/digital converter having an input coupled to the power detector and having an output coupled to the digital signal processor; and
    the modulator having a control input for setting the gain of the modulator, the control input coupled to the digital signal processor for permitting the amplitude of the radio frequency transmission signal to be influenced in a manner dependent on power measured by the power detector,
    wherein the modulator is for processing complex-valued transmission signals, the modulator including a first mixer which is coupled to the digital signal processor via an in-phase branch, and a second mixer which is coupled to the digital signal processor via a quadrature branch, the modulator also including a summation element coupled to an output of the first mixer and an output of the second mixer and having an output that provides the radio frequency transmission signal,
    wherein the digital signal processor comprises a means for influencing the amplitude of the useful signal in a manner dependent on the power measured by the power detector,
    wherein the modulator comprises at least one mixer, having the control input for setting the gain, and
    wherein the modulator comprises a plurality of mixer cells, and wherein each of the mixer cells is, independently of the other mixer cells, connectable into and disconnectable from parallel combination with any of the other mixer cells in response to the control input of the modulator.

14. A transmission arrangement with power regulation, comprising:
- a transmission path comprising a digital signal processor for the digital processing of a useful signal to be transmitted, a digital/analog converter, which is connected downstream of the digital signal processor, and a modulator, which is coupled to an output of the digital/analog converter, for modulating a carrier signal with the useful signal to be transmitted, and which provides a radio frequency transmission signal at an output thereof;
- a power detector coupled to the output of the modulator;
- an analog/digital converter having an input coupled to the power detector and having an output coupled to the digital signal processor; and
- the modulator having a control input for setting the gain of the modulator, the control input coupled to the digital signal processor for permitting the amplitude of the radio frequency transmission signal to be influenced in a manner dependent on power measured by the power detector,
- wherein the modulator comprises a plurality of mixer cells, and wherein each of the mixer cells is, independently of the other mixer cells, connectable into and disconnectable from parallel combination with any of the other mixer cells in response to the control input of the modulator.

15. The transmission arrangement as claimed in claim 14, wherein the modulator is for processing complex-valued transmission signals, the modulator including a first mixer which is coupled to the digital signal processor via an in-phase branch, and a second mixer which is coupled to the digital signal processor via a quadrature branch, the modulator also including a summation element coupled to an output of the first mixer and an output of the second mixer and having an output that provides the radio frequency transmission signal.

16. The transmission arrangement as claimed in claim 15, wherein the digital signal processor comprises a means for influencing the amplitude of the useful signal in a manner dependent on the power measured by the power detector.

17. The transmission arrangement as claimed in claim 15, wherein the modulator comprises at least one mixer, having the control input for setting the gain.

18. The transmission arrangement as claimed in claim 14, wherein the digital signal processor comprises a means for influencing the amplitude of the useful signal in a manner dependent on the power measured by the power detector.

19. The transmission arrangement as claimed in claim 14, wherein the modulator comprises at least one mixer, having the control input for setting the gain.

20. The transmission arrangement as claimed in claim 19, wherein the digital signal processor comprises a means for influencing the amplitude of the useful signal in a manner dependent on the power measured by the power detector.

* * * * *

UNITED STATES PATENT AND TRADEMARK OFFICE
CERTIFICATE OF CORRECTION

PATENT NO. : 7,277,689 B2
APPLICATION NO. : 10/482506
DATED : October 2, 2007
INVENTOR(S) : Martin Simon It is certified that error appears in the above-identified patent and that said Letters Patent is hereby corrected as shown below:

Column 1, line 20: Please replace the word "tamping" with the word --ramping--.

Signed and Sealed this

Twenty-seventh Day of November, 2007

JON W. DUDAS
*Director of the United States Patent and Trademark Office*